(12) United States Patent
Yamaguchi et al.

(10) Patent No.: US 6,439,514 B1
(45) Date of Patent: Aug. 27, 2002

(54) SEMICONDUCTOR DEVICE WITH ELEMENTS SURROUNDED BY TRENCHES

(75) Inventors: Hitoshi Yamaguchi, Obu; Yoshitaka Noda, Chiryu, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/493,937

(22) Filed: Jan. 28, 2000

(30) Foreign Application Priority Data

Feb. 2, 1999 (JP) .............................................. 11-025410

(51) Int. Cl.[7] .............................................. H01L 29/00
(52) U.S. Cl. ........................ 247/500; 257/347; 257/487; 257/491; 257/492; 257/506; 257/510; 257/520
(58) Field of Search .................................. 257/374, 487, 257/491, 492, 493, 500, 503, 506, 507, 508, 510, 511, 520, 523

(56) References Cited

U.S. PATENT DOCUMENTS

| | | |
|---|---|---|
| 5,072,287 A | 12/1991 | Nakagawa et al. |
| 5,241,210 A | 8/1993 | Nakagawa et al. |
| 5,294,825 A | 3/1994 | Nakagawa et al. |
| 5,343,067 A | 8/1994 | Nakagawa et al. |
| 5,378,920 A | 1/1995 | Nakagawa et al. |
| 5,434,444 A | 7/1995 | Nakagawa et al. |
| 5,536,961 A | 7/1996 | Nakagawa et al. |
| 5,592,014 A | 1/1997 | Funaki et al. |
| 5,661,329 A * | 8/1997 | Hiramoto et al. ............ 257/510 |
| 6,104,078 A * | 8/2000 | Iida et al. .................... 257/524 |
| 6,278,156 B1 * | 8/2001 | Kobayashi ................... 257/347 |

FOREIGN PATENT DOCUMENTS

| | | | |
|---|---|---|---|
| JP | 5-267441 | | 10/1993 |
| JP | 8-204130 | * | 8/1996 |
| JP | 9 266248 | * | 9/1997 |
| JP | 9-266248 | * | 10/1997 |

* cited by examiner

Primary Examiner—Nathan J. Flynn
Assistant Examiner—Ahmed N. Sefer
(74) Attorney, Agent, or Firm—Law Offices of David G. Posz

(57) ABSTRACT

Pch-MOS transistors to which a power supply potential is applied are respectively surrounded by first trenches, and Nch-MOS transistors to which a ground potential is applied are respectively surrounded by second trenches. The first trenches are surrounded by a third trench, and the second trenches are surrounded by a fourth trench. A silicon layer existing inside the third trench is set at the power source potential. The silicon layer existing between the third and fourth trenches are set at a floating state. Accordingly, each thickness of oxide layers filling the trenches can be reduced.

19 Claims, 15 Drawing Sheets

US 6,439,514 B1

SEMICONDUCTOR DEVICE WITH ELEMENTS SURROUNDED BY TRENCHES

CROSS REFERENCE TO RELATED APPLICATION

This application is based upon and claims the benefit of Japanese Patent Application No. 11-25410 filed on Feb. 2, 1999, the contents of which are incorporated herein by reference.

BACKGROUND OF THE INVENTION

1. Field of the Invention

This invention relates generally to a semiconductor device having an SOI (Silicon On Insulator) structure, and particularly to an IC for outputting a high voltage with several steps to drive a flat panel display such as an electroluminescent (EL) display or a plasma display.

2. Description of the Related Art

An insulating isolation type high voltage IC includes several high withstand voltage elements. In the high voltage IC, as shown in FIGS. 14 and 15, elements 101 are respectively connected to power supply lines for applying a power supply voltage Vdd, and elements 102 are connected to GND lines for applying a ground potential. Further, the elements 101, 102 are respectively surrounded by trenches 103 to thereby being electrically isolated from each other.

When the outside of the trenches 103 is fixed to the GND potential in the high voltage IC, no voltage is applied to the trenches 103 surrounding the elements 102 which are connected to the GND lines. However, the power supply voltage is applied to other trenches 103 surrounding the elements 101 which are connected to the power supply lines. In this case, thermally oxidized layers 104 formed in the trenches 103 should be thickened to prevent dielectric breakdown thereof from being caused by the power supply voltage applied to the trenches 103.

When the thermally oxidized layers 104 are thickened, however, crystal defects are easily produced at interfaces between the thermally oxidized layers 104 and a silicon layer 105 constituting the elements 101, 102 due to a difference in thermal expansion coefficient between the thermally oxidized layers 104 and the silicon layer 105.

SUMMARY OF THE INVENTION

The present invention has been made in view of the above problem. An object of the present invention is to provide a semiconductor device having a trench for insulating isolation and an oxide film filling the trench with a decreased thickness.

According to the present invention, a plurality of first semiconductor elements, which have a first electric potential, are surrounded by a plurality of first trenches. A plurality of second semiconductor elements, which have a second electric potential smaller than the first electric potential, are surrounded by a plurality of second trenches. The first trenches are further surrounded by a third trench, and the second trenches are further surrounded by a fourth trench. A silicon layer extending between the first trenches and the third trench has a third electric potential larger than the second electric potential. Preferably the third electric potential is substantially equal to the first electric potential.

In this case, no voltage is applied across the first trenches, so that oxide layers filling the first trenches can be thinned. Crystal defects are hardly produced by a difference in thermal expansion coefficient between the oxide layer and the silicon layer. For example, each thickness T of the oxide layers can be set to satisfy a formula of T<V/E, in which V represents a potential difference between the first and second electric potentials, and E represents a breakdown electric field strength of the oxide layers.

According to the present invention, a first trench surrounds all of a plurality of first semiconductor elements, and a second trench surrounds all of a plurality of second semiconductor elements. A portion of a silicon layer extending outside the first and second trenches is electrically floating. In this case, a potential difference between first and second electric potentials of the first and second semiconductor elements can be supported by the first and second trenches. As a result, oxide layers filling the first and second trenches can be thinned as well.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS (First Embodiment)

Figure 1:
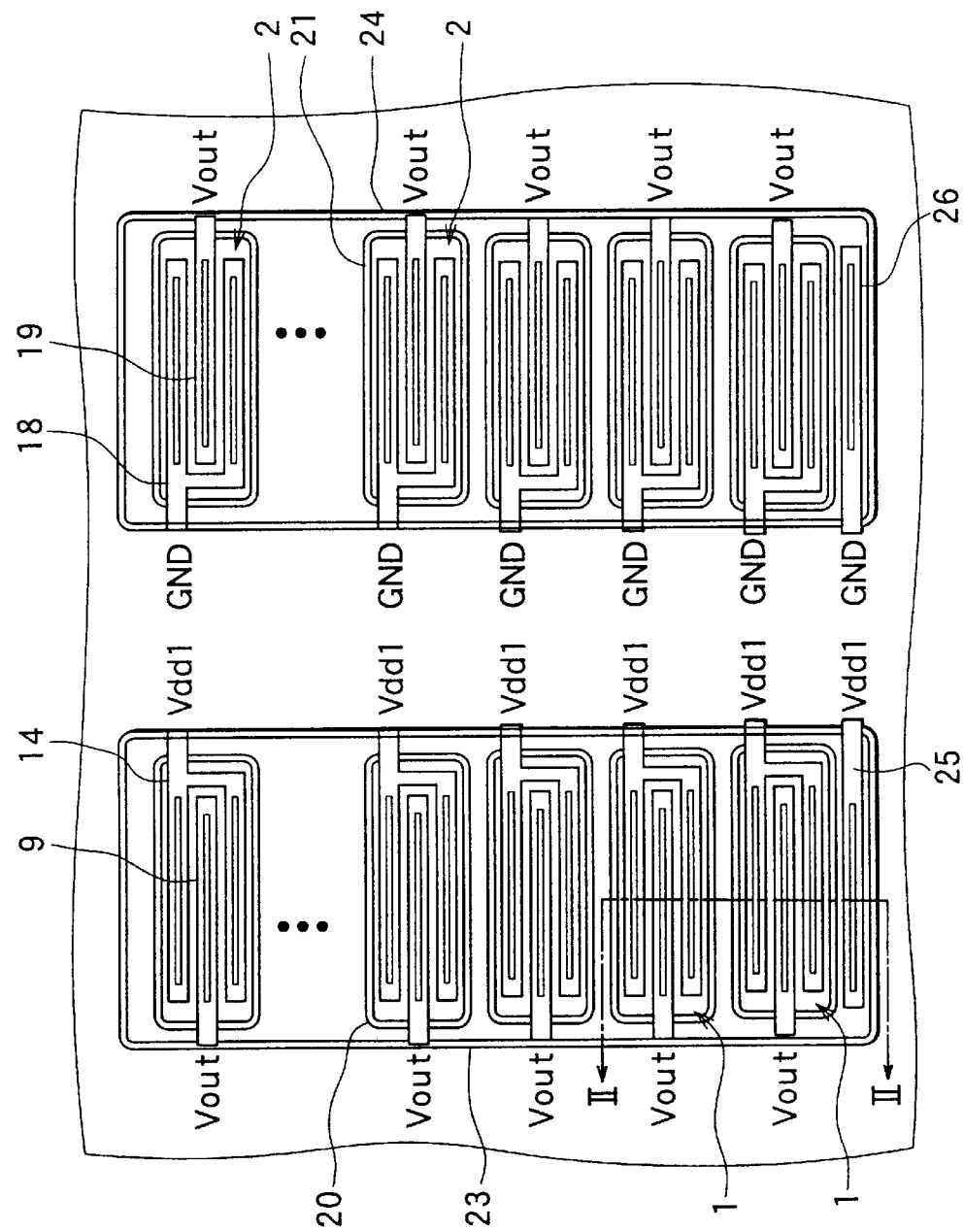
FIG. 1 is a top plan view showing a high-voltage IC in a first preferred embodiment of the present invention.

A first preferred embodiment of the present invention is explained with reference to FIGS. 1 and 2 below. As shown in FIG. 1, a high-voltage IC in the first embodiment has regularly arranged several semiconductor elements. The several semiconductor elements are composed of high withstand voltage Pch-MOS transistors 1 arranged in a file at a left side in FIG. 1, and high withstand voltage Nch-MOS transistors 2 arranged in a file at a right side in FIG. 1.

Figure 2:
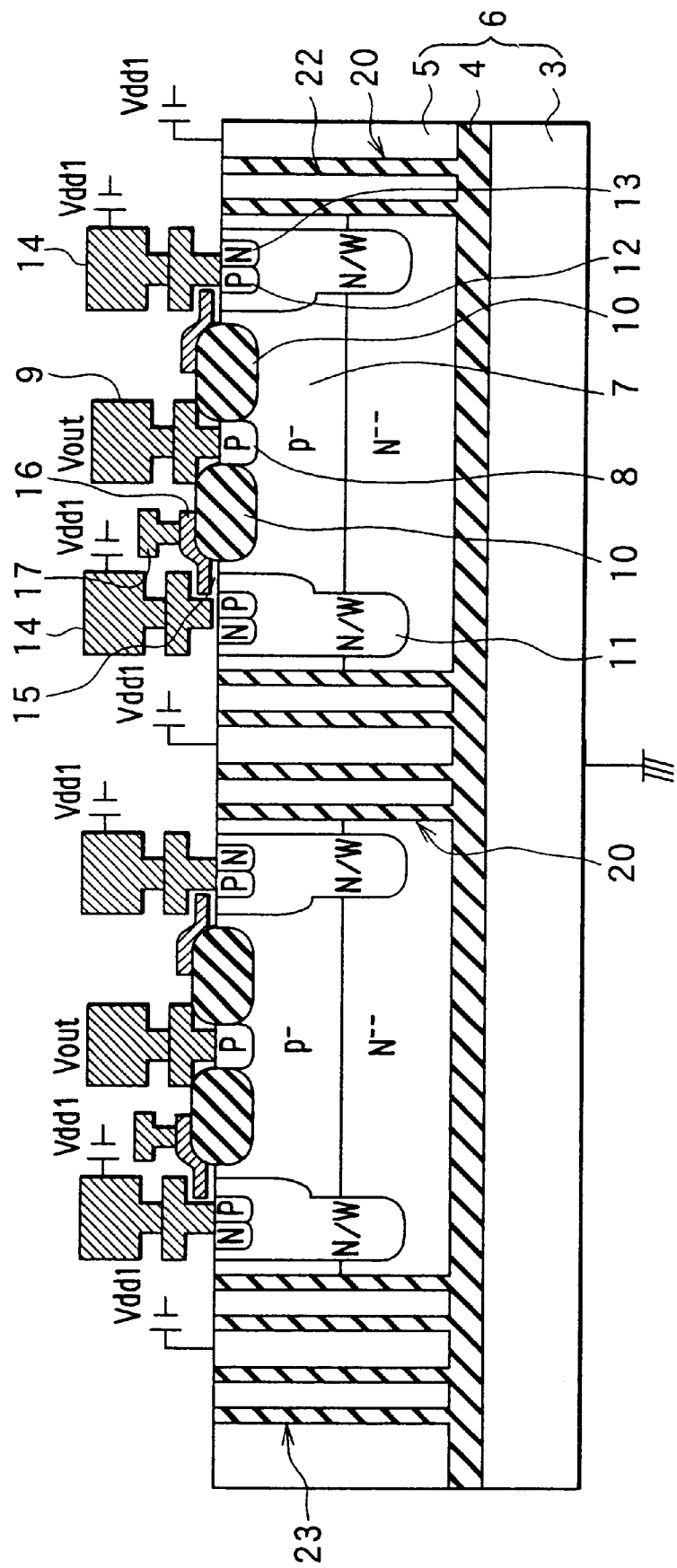
FIG. 2 is a cross-sectional view showing the high-voltage IC, taken along line II—II in FIG. 1.

As shown in FIG. 2, each of the Pch-MOS transistors 1 is formed in an SOI substrate 6 composed of a silicon substrate (first silicon layer) 3, an oxide film (first insulation film) 4, an n⁻ type silicon layer (second silicon layer) 5 stacked with in this order. A p⁻ type layer 7 is formed in a surface portion of the silicon layer 5, and a p type layer 8 is formed as a drain contact at a center of a surface portion of the p⁻ type layer 7. A drain electrode 9 is disposed on the p type layer 8.

A LOCOS oxide film 10 is provided at both sides of the p type layer 8, and an n type well layer 11 is provided at both sides of the LOCOS film 10. The n type well layer 11 is formed by a deep diffusion step and by a shallow diffusion step performed around a substrate surface portion. A p type layer 12 as a source and an n⁺ type layer 13 for providing contact between a source electrode 14 and the n type well layer 11 are provided in the surface portion of the n type well layer 11. The source electrode 14 is disposed on the p type layer 12 and the n⁺ type layer 13.

A gate electrode layer 16 extends above the n type well layer 11 between the p⁻ type layer 7 and the p type layer 12 via a gate oxide film 15, and a gate electrode 17 is disposed on the gate electrode layer 16. A control circuit is integrated on one chip for the high voltage IC to control the respective MOS transistors 1, 2, though the control circuit is not shown.

Each Pch-MOS transistor 1 has the structure described above, and performs a MOS operation with a channel region, which is induced into the surface portion of the n type well layer 11 between the p⁻ type layer 7 and the p type layer 12. The source electrode 14 of the Pch-MOS transistor 1 is connected to a power supply line so that a power supply voltage Vdd1 (for example, 200 V) is applied thereto. The drain electrode 9 is connected to an output Vout, and the gate electrode 17 is connected to the control circuit. Referring back to FIG. 1, in each Nch-MOS transistor 2, a source electrode 18 is connected to a GND line, a drain electrode 19 is connected to an output Vout, and a gate electrode is connected to the control circuit.

Each Pch-MOS transistor 1 is surrounded by a first trench 20, and each Nch-MOS transistor 2 is surrounded by a second trench 21. Thermally oxidized layers 22 are formed by thermally oxidizing inner walls of the first and second trenches 20, 21 to electrically isolate the MOS transistors from one another. Further, a third trench 23 is formed to surround all of the first trenches 20, and a fourth trench 24 is formed to surround all of the second trenches 21. Inside and outside of the respective trenches 23, 24 are isolated from each other by thermally oxidized layers, which are formed by thermally oxidizing the inner walls of the trenches 23, 24 substantially in the same manner as that for the thermally oxidized layers 22.

As shown in FIG. 1, an electrode 25, which is connected to the power supply line, is disposed inside the third trench 23. Accordingly, the power supply voltage Vdd1 is applied to the silicon layer 5 between the third trench 23 and the first trenches 20. An electrode 26 connected to the GND line is disposed inside the fourth trench 24. Accordingly, the silicon layer 5 between the fourth trench 24 and the second trench 21 is brought into a zero potential. The silicon layer 5 at the outside of both the third trench 23 and the fourth trench 24 is set at a floating state.

Thus, the power supply voltage Vdd1 applied to the silicon layer 5 at the inside of the third trench 23 is the same as the voltage applied to the insides of the first trenches 20. Accordingly, the silicon layer 5 can have the same potential at the insides and the outsides of the first trenches 20. The power supply voltage Vdd1 is not applied across the first trenches 20, thereby preventing an adverse effect to the semiconductor elements.

A high potential difference of 200 V between the power supply voltage Vdd1 and the GND potential is supported by the thermally oxidized layers 22 in both the third trench 23 and the fourth trench 24. Therefore, each thickness of the thermally oxidized layers 22 formed in the third and fourth trenches 23, 24 can be decreased. For example, when an electric field strength applied to a thermally oxidized layer is designed to be less than 3 MV/cm in a case where the power supply voltage Vdd1 is supported only by one trench as a prior art, the thickness required for the thermally oxidized layer is 670 nm (=200 V/3 MV/cm) or more. To the contrary, in the case where the potential difference between the power supply voltage Vdd1 and the GND potential is supported by the two trenches as in the present embodiment, it is sufficient for each thermally oxidized layer 22 to have a thickness of 335 nm.

Because the thermally oxidized layers 22 can be thinned in the present embodiment, crystal defects can be prevented from being produced by a difference in thermal expansion coefficient between the thermally oxidized layers 22 and the silicon layer 5.

Figure 3:
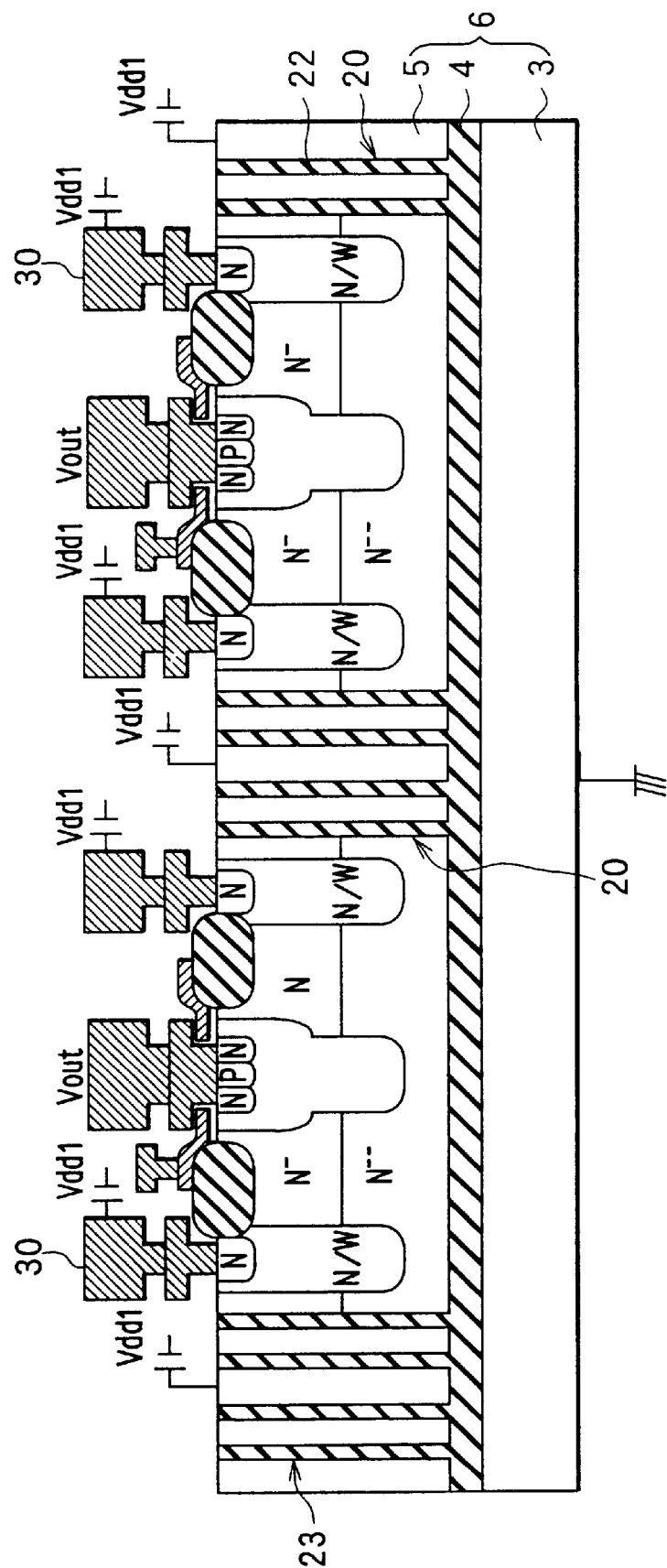
FIG. 3 is a cross-sectional view showing Nch-MOS transistors connected to power supply lines as a modification of the first embodiment.
Figure 4:
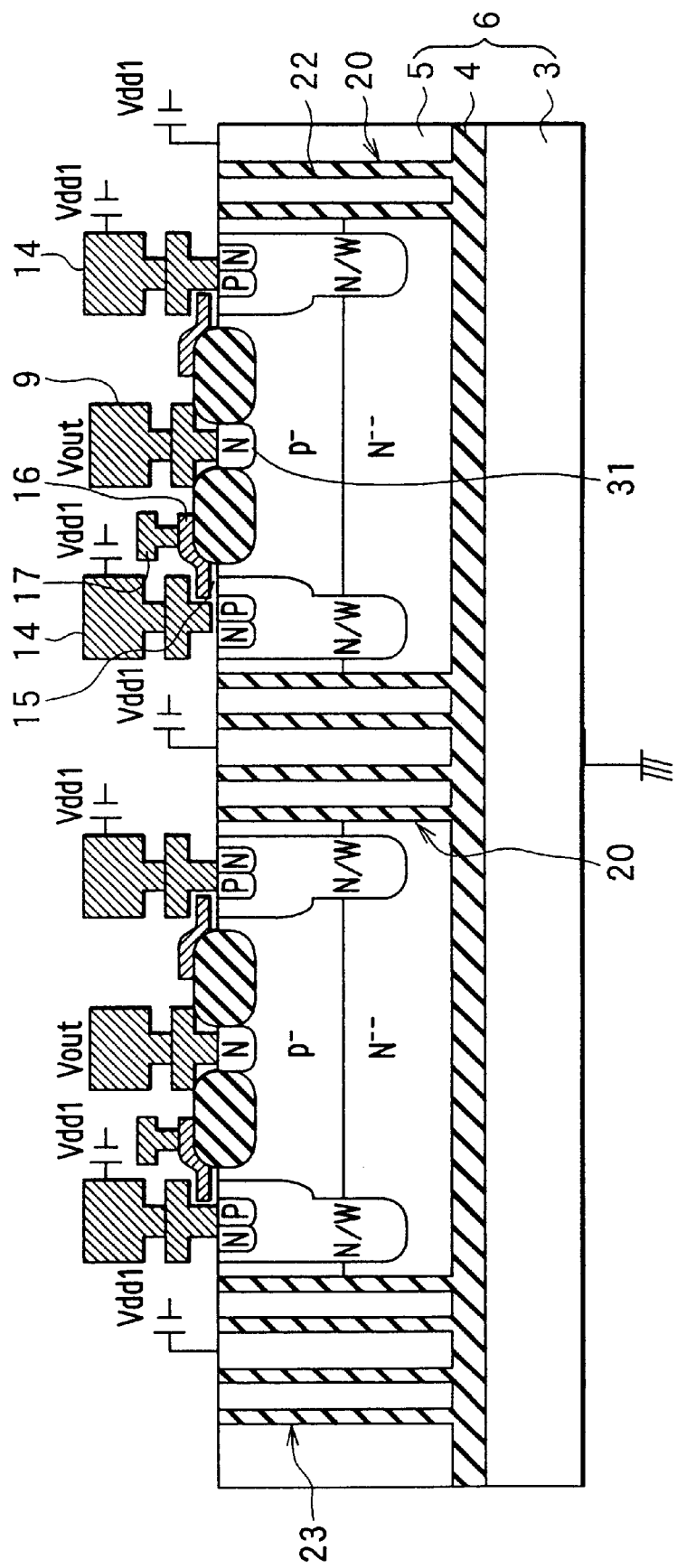
FIG. 4 is a cross-sectional view showing IGBTs connected to power source lines as another modification of the first embodiment.

In the present embodiment, the present invention is applied to the case where each Pch-MOS transistor is connected to the power supply line to which the power supply voltage Vdd1 is applied. However, as shown in FIG. 3, the present invention can be applied to a case where each Nch-MOS transistor is connected to the power supply line. In FIG. 3, a drain of each Nch-MOS transistor is connected to the power supply line. As shown in FIG. 4, the present invention can be applied to IGBTs in addition to the MOS transistors 1, 2. Each IGBT shown in FIG. 4 has an n type layer 31 in place of the p type layer 8 shown in FIG. 2.

In the present embodiment, the electrode 25 disposed inside the third trench 23 is connected to the power source line to have a power source potential, and the electrode 26 disposed inside the fourth trench 24 is connected to the GND line to have a GND potential. In addition, it is acceptable that either or both of the electrodes 25, 26 have potentials between the power source potential and the GND potential.

(Second Embodiment)

Figure 5:
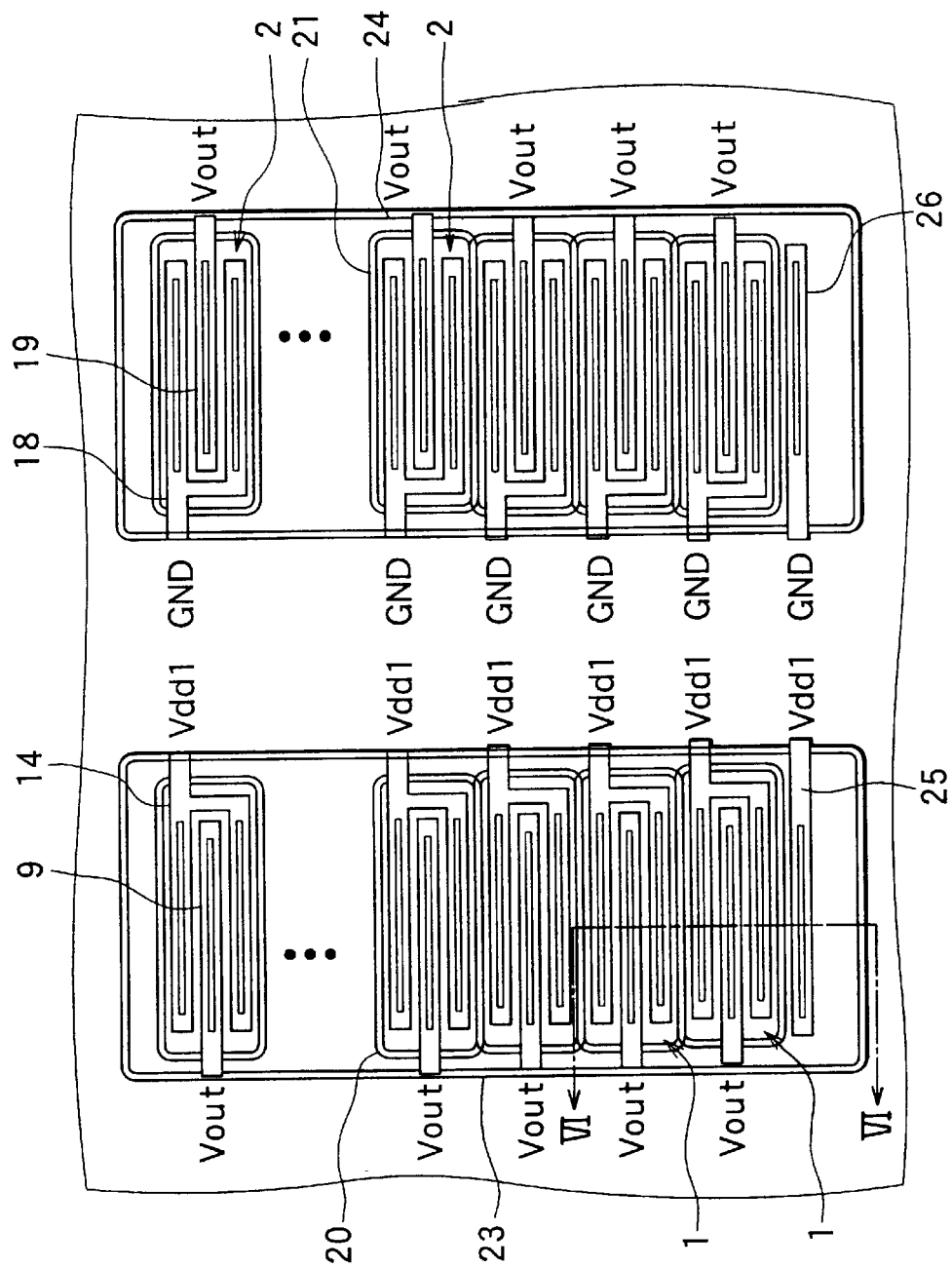
FIG. 5 is a top plan view showing a high-voltage IC in a second preferred embodiment of the present invention.
Figure 6:
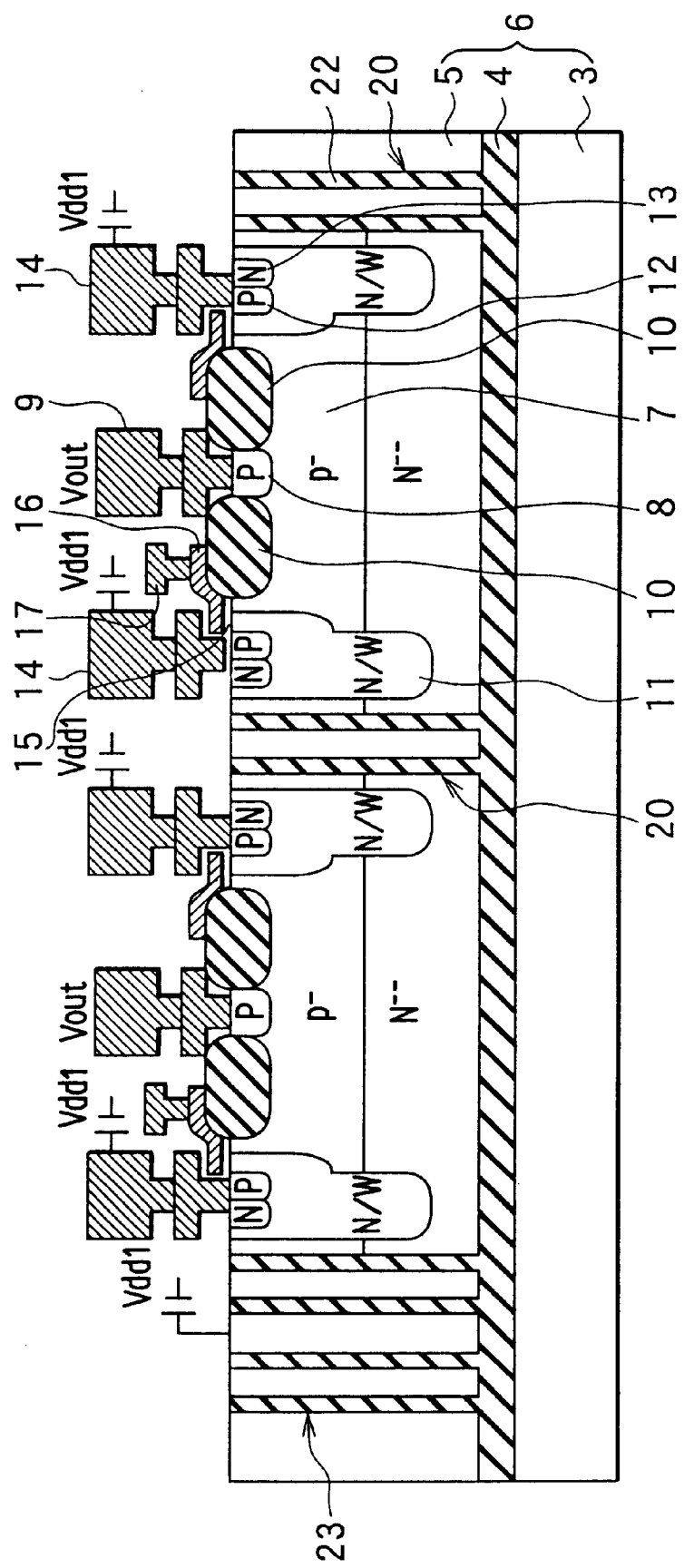
FIG. 6 is a cross-sectional view showing the high-voltage IC, taken along line VI—VI in FIG. 5.

A second preferred embodiment of the present invention is explained referring to FIGS. 5 and 6, in which the same parts as those in the first embodiment are assigned to the same reference numerals, and the same explanation will not be reiterated.

As shown in FIGS. 5 and 6, one of the first trenches 20 surrounding one of the Pch-MOS transistors 1 is partially overlapped with adjacent one of the first trenches 20 surrounding adjacent one of the Pch-MOS transistors 1. That is, the overlapping part of the adjacent two first trenches 20 is common to the adjacent two transistors 1. Adjacent two second trenches 21 surrounding adjacent two Nch-MOS transistors 2 are also overlapped with each other. Therefore, the overlapping part of the adjacent two second trenches 21 is common to the adjacent two transistors 2. The other features are substantially the same as those in the first embodiment.

Accordingly, the same effects as those in the first embodiment can be provided. In addition, the high voltage IC can have an increased integration density in an arrangement direction of the Pch-MOS transistors 1 and the Nch-MOS transistors 2, resulting in an improved area efficiency in element arrangement. For example, a dimension of each element in the arrangement direction shown in FIGS. 5 and 6 can be decreased by approximately 15 $\mu$m as compared to that shown in FIGS. 14 and 15, resulting in size reduction corresponding to several elements.

(Third Embodiment)

Figure 7:
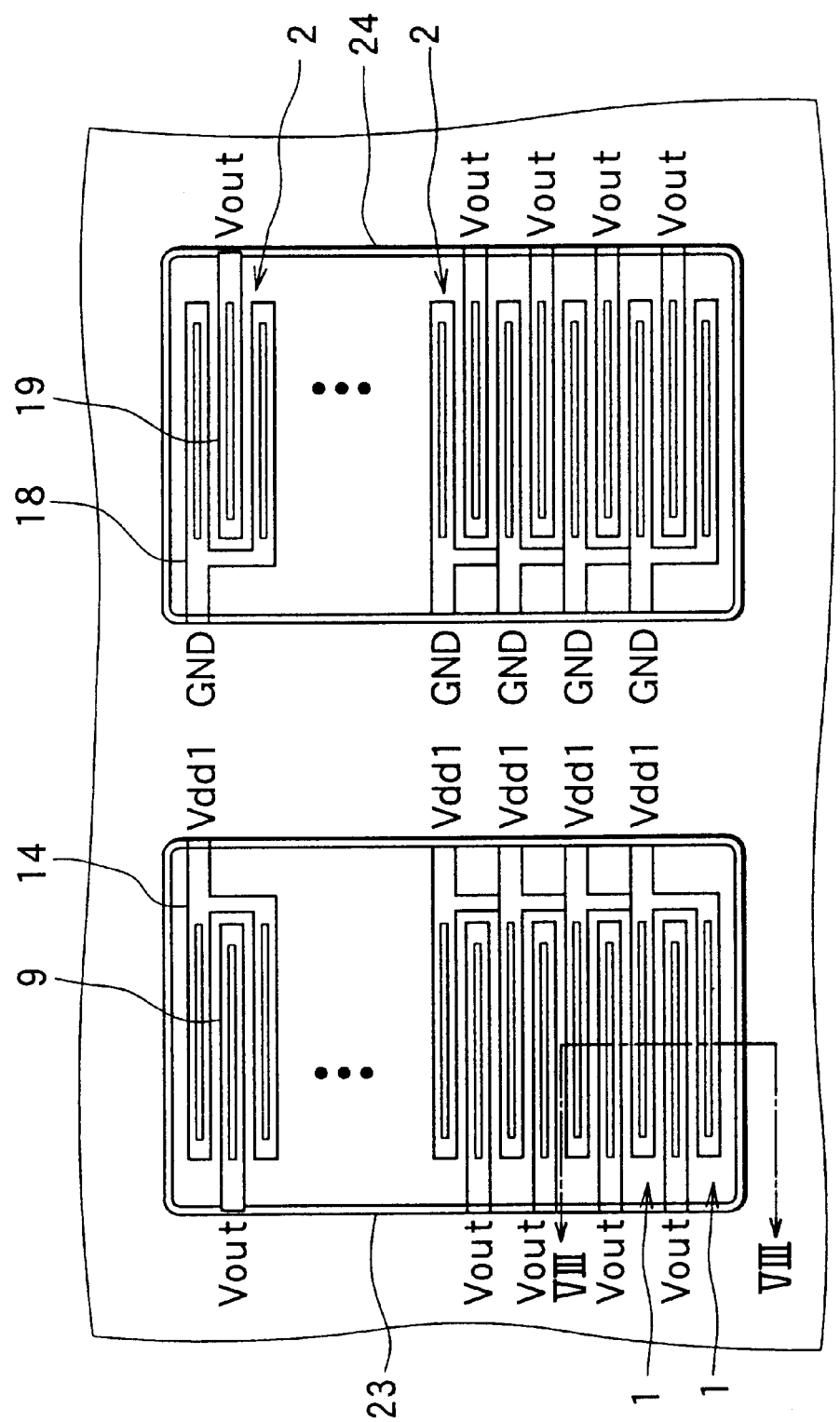
FIG. 7 is a top plan view showing a high-voltage IC in a third preferred embodiment of the present invention.
Figure 8:
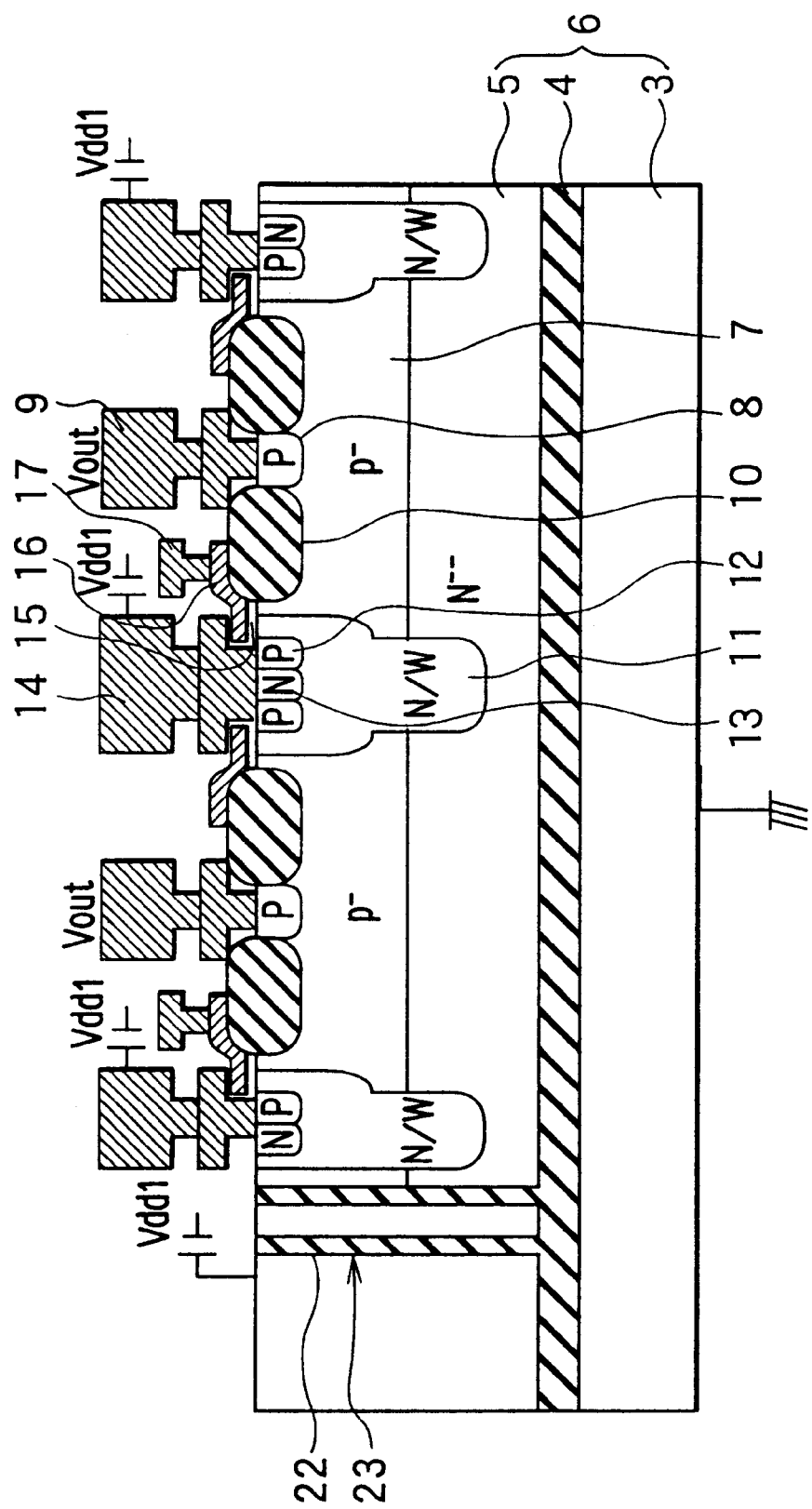
FIG. 8 is a cross-sectional view showing the high-voltage IC, taken along line VIII—VIII in FIG. 7.

A third preferred embodiment of the present invention is explained referring to FIGS. 7 and 8, in which the same parts as those in the first embodiment are assigned to the same reference numerals and the same explanation will not be reiterated.

As shown in FIGS. 7 and 8, a high-voltage IC in the third embodiment dispenses with the first and second trenches 20, 21 surrounding the MOS transistors 1, 2. Adjacent two Pch-MOS transistors 1 have a common source portion including the p type layer 12 and the like. Accordingly, the high-voltage IC can have an increased integration density in the arrangement direction of the Pch-MOS transistors 1, resulting in improved area efficiency of element arrangement.

Figure 14:
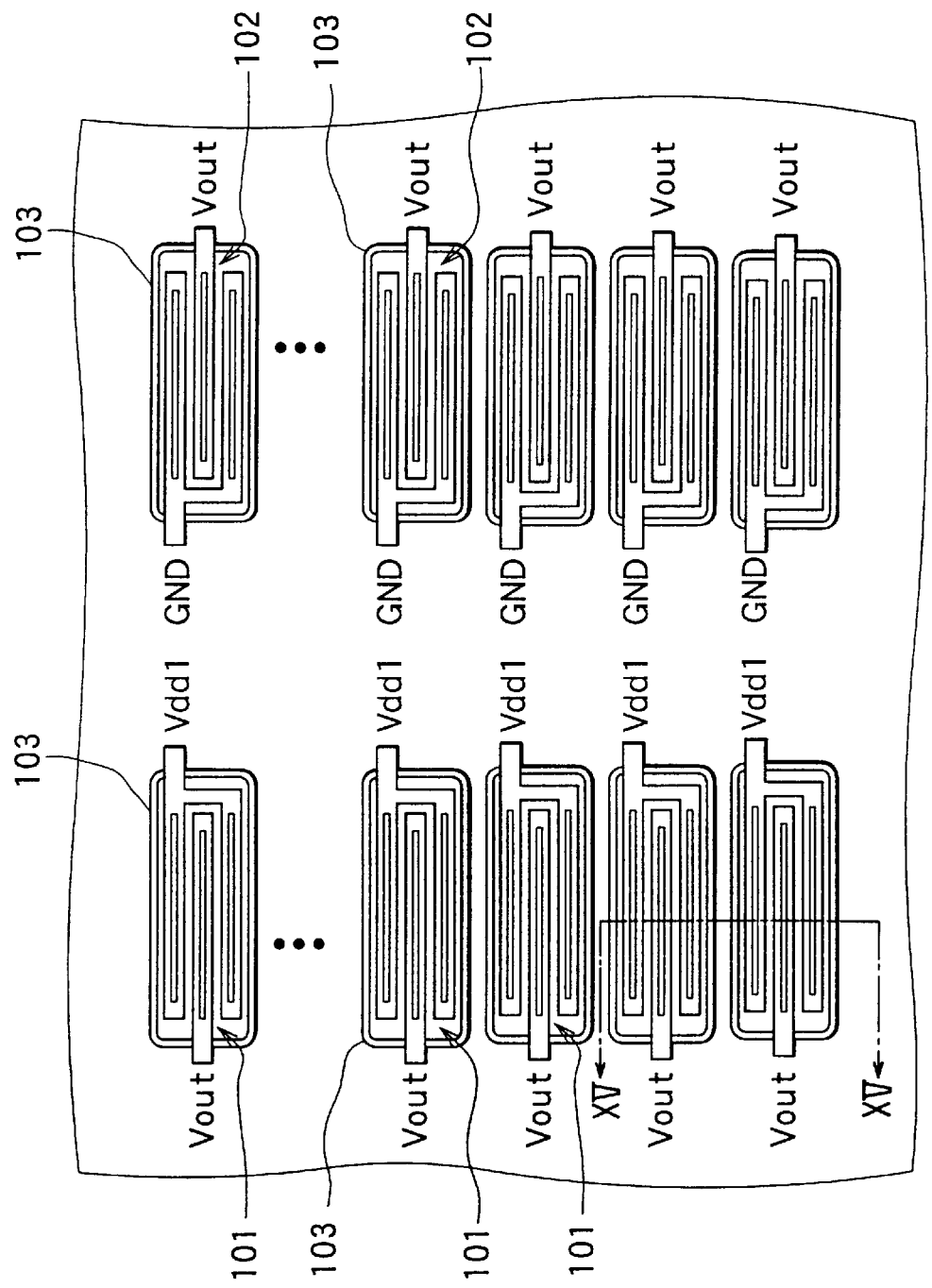
FIG. 14 is a top plan view showing a high-voltage IC according to a related art.
Figure 15:
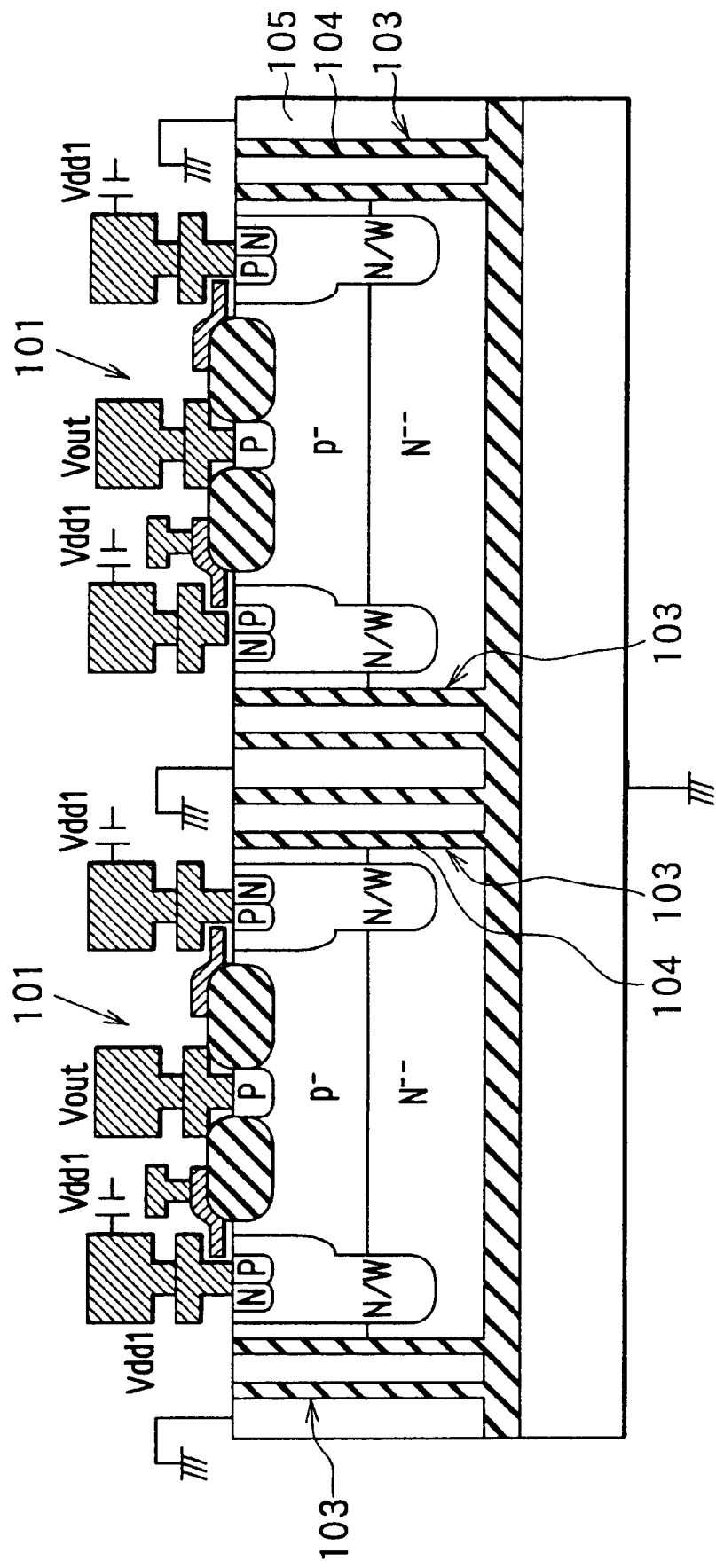
FIG. 15 is a cross-sectional view showing the high-voltage IC, taken along line XV—XV in FIG. 14.

For example, in the present embodiment shown in FIGS. 7 and 8, a dimension of each element can be decreased by approximately 30 $\mu$m as compared to that shown in FIGS. 14 and 15, resulting in size reduction corresponding to several elements. In this case, the silicon layer 5 at the outside of the third and fourth trenches 23, 24 is electrically floating.

In the third embodiment, as in the first embodiment, a high potential difference of 200V between the power supply voltage Vdd1 applied to the inside of the third trench 23 and the GND potential applied to the inside of the fourth trench 24 can be supported by the thermally oxidized layers 22 formed in the third and fourth trenches 23, 24. Therefore, the same effect as in the first embodiment can be provided. In addition, since one source portion is common to adjacent two Pch-MOS transistors 1, the transistors 1, 2 surrounded by the third and fourth trenches 23 do not interfere with one another during operation, thereby preventing adverse effects to the IC control.

In the present embodiment, the present invention is applied to the Pch-MOS transistors 1, each of which is connected to the power supply line to which the power source voltage vdd1 is applied. However, the present invention may be applied to other semiconductor elements, provided that the semiconductor elements have portions capable of being fixed at an identical potential and made common.

Figure 9:
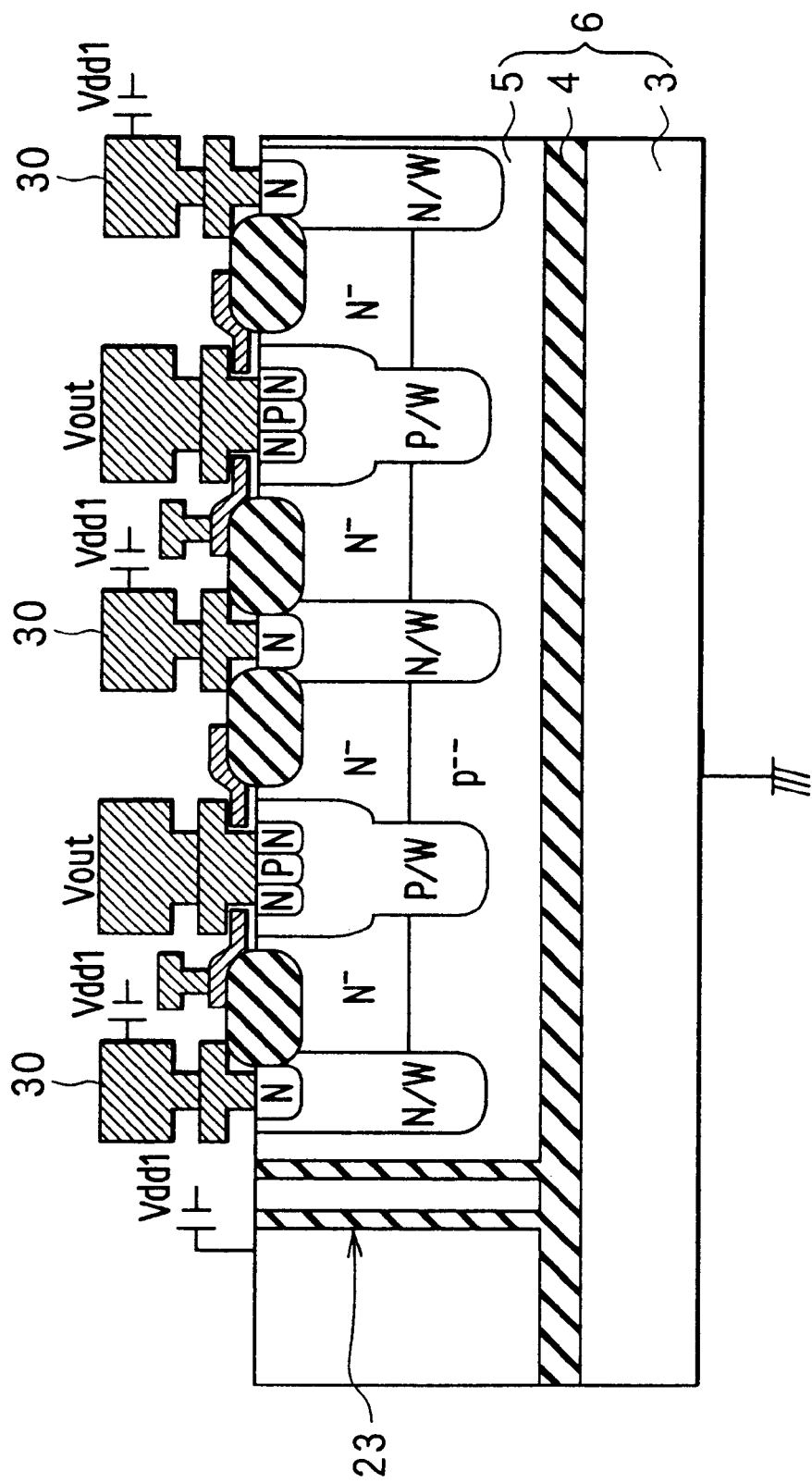
FIG. 9 is a cross-sectional view showing Nch-MOS transistors connected to power source lines as a modification of the third embodiment.
Figure 10:
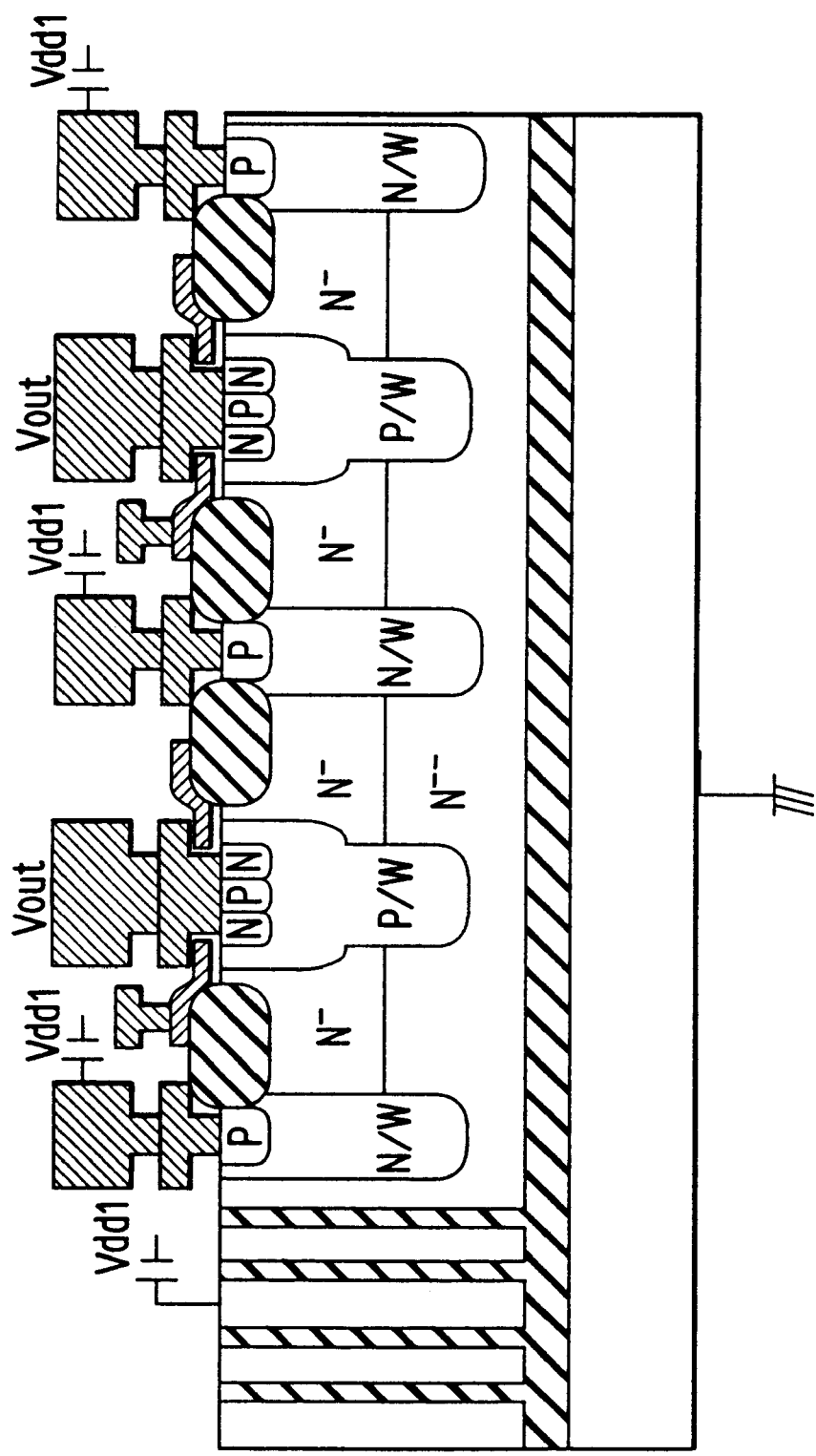
FIG. 10 is a cross-sectional view showing IGBTs connected to power source lines as another modification of the third embodiment.

For example, the present invention can be applied to a case where each Nch-MOS transistor is connected to a power supply line as shown in FIG. 9. In FIG. 9, a drain portion is common to adjacent two transistors. Further, as shown in FIG. 10, IGBTs can be adopted in place of the MOS transistors 1. Each of the IGBTs is an n channel type having impurity layers, each conductive type of which except for layers corresponding to the p type layer 8 and the n⁻ type layer 5 shown in FIG. 8 are inverted as compared to those shown in FIG. 8.

(Fourth Embodiment)

Figure 11:
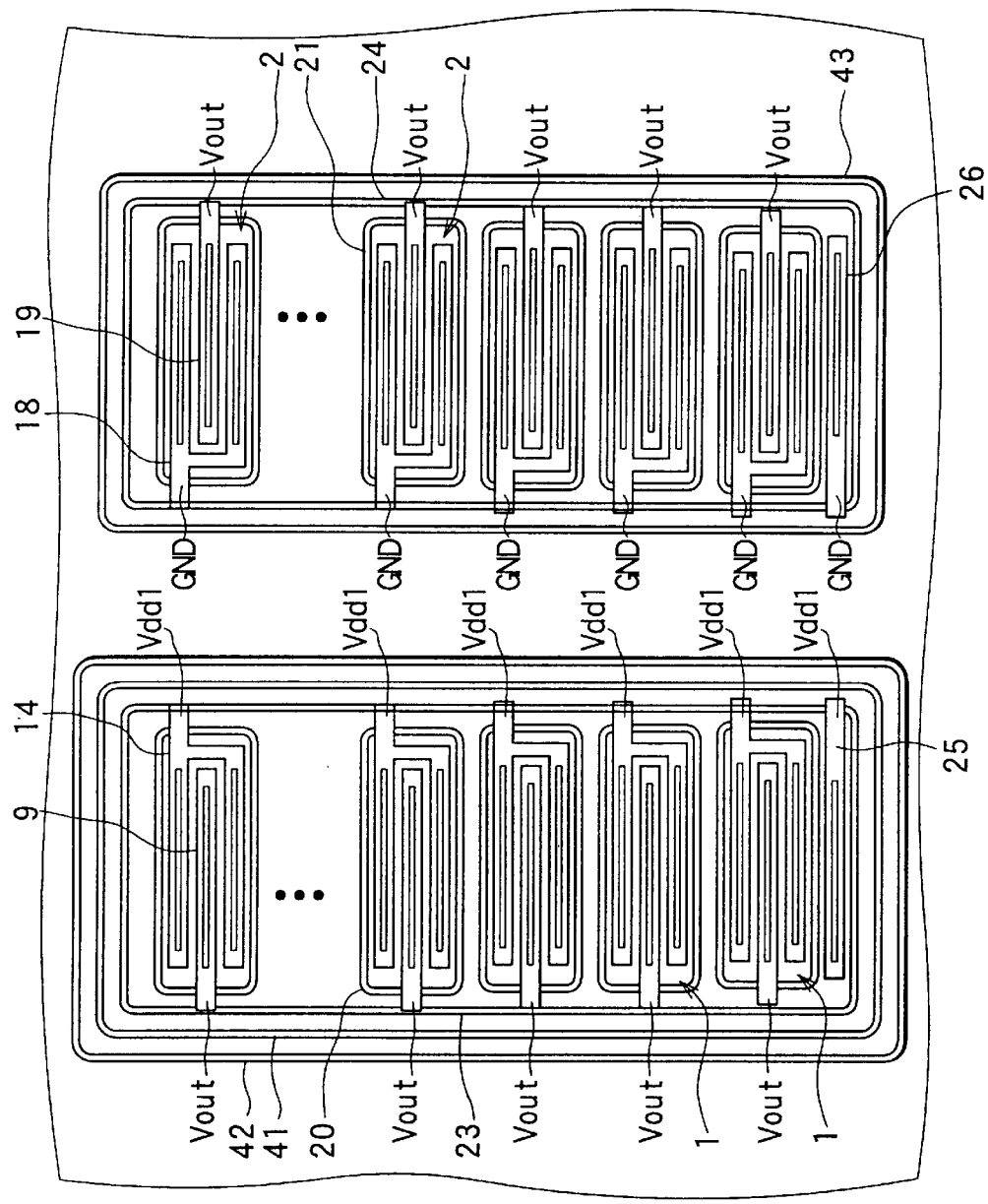
FIG. 11 is a top plan view showing a high-voltage IC in a fourth preferred embodiment of the present invention.

A fourth preferred embodiment of the present invention is explained referring to FIG. 11, in which the same parts as those in the first embodiment are assigned to the same reference numerals and the same explanation will not be reiterated.

As shown in FIG. 11, in the fourth embodiment, the third trench 23 is surrounded by fifth and sixth trenches 41, 42, and the fourth trench 24 is surrounded by a seventh trench 43. A portion between the third trench 23 and the fifth trench 41, a portion between the fifth trench 41 and the sixth trench 42, a portion between the fourth trench 24 and the seventh trench 43, and a portion between the sixth trench 42 and the seventh trench 43 are set at a floating state.

In this case, a high potential difference between the power supply voltage vdd1 applied to the inside of the third trench 23 and the GND potential applied to the inside of the fourth trench 24 is supported by thermally oxidized layers 22 formed in five trenches including the third trench 23, the fifth trench 41, the sixth trench 42, the seventh trench 43 and the fourth trench 24. Therefore, each thickness of the thermally oxidized layers 22 can be decreased more than that in the first embodiment, and crystal defects are further prevented from being produced around the trenches.

In the first embodiment, the outsides of the third and fourth trenches 23, 24 are set at the floating state; however, the outsides of the third and fourth trenches 23, 24 may be set at the GND potential. In this case, the third trench 23 is surrounded by the fifth trench 41 and the sixth trench 42 and the portions between the third trench 23 and the fifth trench 41 and between the fifth trench 41 and the sixth trench 42 are set at the floating state as in the fourth embodiment. Accordingly, the power supply voltage Vdd1 can be supported by more than two trenches.

In the embodiments described above, the present invention is applied to the transistors 1, 2 respectively connected to the power supply lines and the GND lines. However, the present invention is not limited to this case, but may be applied to semiconductor elements connected to an electrical potential dropping from that of the power source line.

In the embodiments described above, the Pch-MOS transistors 1 are respectively connected to the identical power source voltage Vdd1, and the Nch-MOS transistors 2 are respectively connected to the identical GND potential. However, the present invention can be applied to a case where semiconductor elements surrounded by a trench (for example, the Pch-MOS transistors 1, which are surrounded by the third trench 23 in FIG. 1) are connected to electric potentials different from one another.

In this case, for example, it is advisable that a first group of the elements, to which a voltage higher than a middle potential between the power supply voltage Vdd1 and the GND potential is applied, are surrounded by one trench, and an inside of the trench is connected to the power supply line. It is further advisable that a second group of the elements, to which a voltage lower than the middle potential are surrounded by another trench, and an inside of the trench is connected to the GND line. The insides of the trenches are not always connected to the power supply line or the GND line, and may be set at appropriate potentials so that voltages applied across the trenches can be made smaller than the power supply voltage Vdd1.

Figure 12:
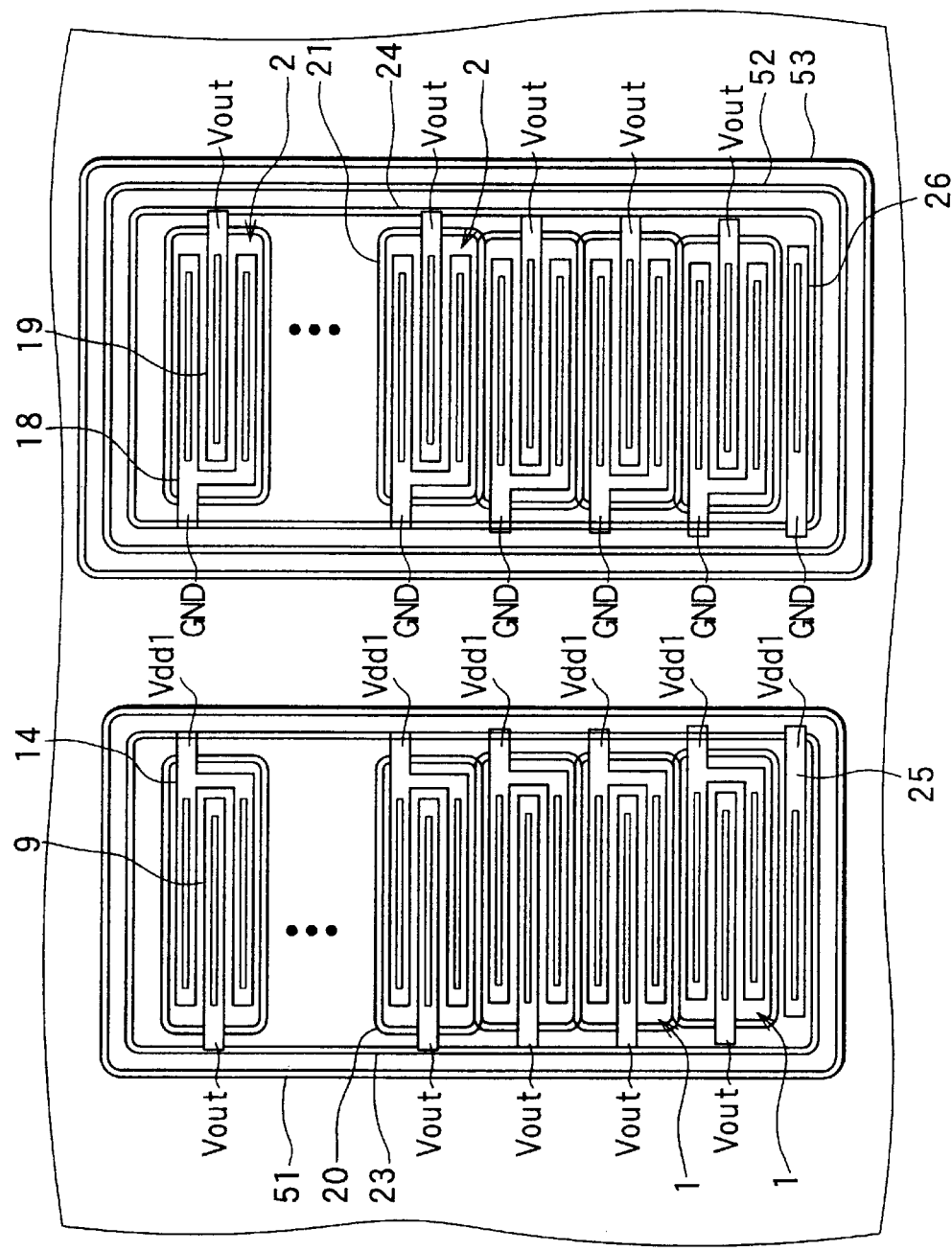
FIG. 12 is a top plan view showing a high-voltage IC in a modified embodiment of the present invention.

In the fourth embodiment, although the third trench 23 is surrounded by the fifth and sixth trenches 41, 42, and the fourth trench 24 is surrounded by the seventh trench 43, the numbers of the trenches surrounding the transistors 1, 2 are not limited to those. The first to fourth embodiments can be appropriately combined with each other. For example, as shown in FIG. 12, the transistors 1, 2 in the second embodiment having common portions of adjacent first and second trenches 20, 21 may be surrounded by several trenches 51, 52, 53, respectively.

Figure 13:
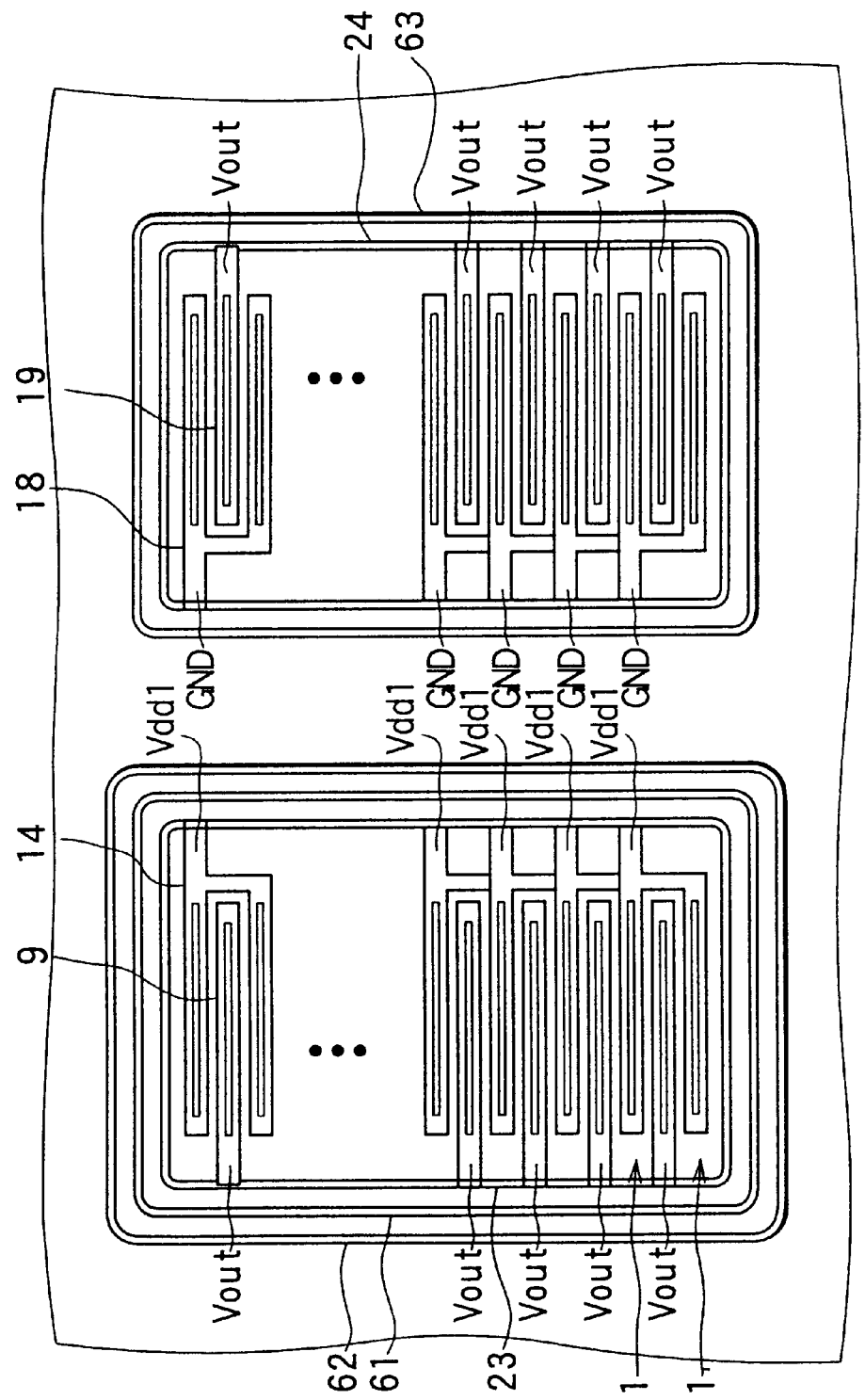
FIG. 13 is a top plan view showing a high-voltage IC in another modified embodiment of the present invention.

Further, as shown in FIG. 13, the transistors 1, 2 in the third embodiment including common identical potential portions of adjacent transistors 1, 2 and surrounded by the third and fourth trenches 23, 24 may be further surrounded by several trenches 61, 62, 63. The present invention can be applied to various semiconductor elements such as LDMOS transistors, L-IGBT transistors, and thyristors.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a first silicon layer;
   a first insulation film disposed on the first silicon layer;
   a second silicon layer disposed on the first insulation film;
   a plurality of first semiconductor elements provided in the second silicon layer to have a first electric potential;
   a plurality of second semiconductor elements provided in the second silicon layer to have a second electric potential smaller than the first electric potential;
   a plurality of first trenches provided in the second silicon layer to reach the first insulation film and respectively surrounding the plurality of first semiconductor elements;
   a plurality of second trenches provided in the second silicon layer to reach the first insulation film and respectively surrounding the plurality of second semiconductor elements;
   a third trench provided in the second silicon layer to reach the first insulation film and surrounding the plurality of first trenches; and
   a fourth trench provided in the second silicon layer to reach the first insulation film and surrounding the plurality of second trenches,
   wherein a portion of the second silicon layer between the plurality of first trenches and the third trench has a third electric potential larger than the second electric potential.

2. The semiconductor device of claim 1, wherein the third electric potential is substantially equal to the first electric potential.

3. The semiconductor device of claim 2, wherein:
   a power source voltage is applied to the plurality of first semiconductor elements; and
   a ground potential is applied to the plurality of second semiconductor elements.

4. The semiconductor device of claim 1, wherein:
   first one and second one of the plurality of first semiconductor elements adjacent to each other are surrounded by first one and second one of the plurality of first trenches, which are partially overlapped with each other.

5. The semiconductor device of claim 4, wherein:
   first one and second one of the plurality of second semiconductor elements adjacent to each other are surrounded by first one and second one of the plurality of second trenches, which are partially overlapped with each other.

6. The semiconductor device of claim 1, further comprising a fifth trench provided in the second silicon layer to reach the first insulation layer and surrounding one of the third and fourth trenches.

7. The semiconductor device of claim 6, wherein a portion of the second silicon layer extending between the fifth trench and the one of the third and fourth trenches is set at a floating state.

8. The semiconductor device of claim 1, wherein the second silicon layer extending outside the third and fourth trenches is set at a floating state.

9. The semiconductor device of claim 1, wherein:
   the plurality of first trenches, the plurality of second trenches, the third trench, and the fourth trench are filled with oxide layers having specific thicknesses; and
   each of the specific thicknesses T satisfies a formula of T<V/E, wherein:
   V represents a potential difference between the first and second electric potentials; and
   E represents a breakdown electric field strength of the oxide layers.

10. The semiconductor device of claim 1, wherein:
    one of the plurality of first semiconductor elements, which is surrounded by one of the plurality of first trenches, has a plurality of contact portions; and
    one of the plurality of contact portions, which is arranged most adjacently to the one of the plurality of first trenches, has the first electric potential.

11. The semiconductor device of claim 1, wherein the plurality of the first semiconductor elements and the plurality of second semiconductor elements are selected from a group consisting of LDMOS transistors, L-IGBT transistors, and thyristors.

12. The semiconductor device of claim 1, wherein the third electric potential is less than the first electric potential.

13. A semiconductor device comprising:
    a first silicon layer;
    a first insulation film disposed on the first silicon layer;
    a second silicon layer disposed on the first insulation film;
    a plurality of first semiconductor elements provided in the second silicon layer to have a first electric potential larger than a specific electric potential;
    a plurality of second semiconductor elements provided in the second silicon layer to have a second electric potential smaller than the specific electric potential;
    a first trench provided in the second silicon layer to reach the first insulation film and surrounding all of the plurality of first semiconductor elements; and
    a second trench provided in the second silicon layer to reach the first insulation film and surrounding all of the plurality of second semiconductor elements, wherein:
    a first portion of the second silicon layer extending inside the first trench has a third electric potential larger than the specific electric potential;
    a second portion of the second silicon layer extending inside the second trench has a fourth electric potential smaller than the specific electric potential; and
    a third portion of the second silicon layer extending outside the first trench and the second trench is electrically floating.

14. The semiconductor device of claim 13, wherein;
the third electric potential is substantially equal to the first electric potential; and
the fourth electric potential is substantially equal to the second electric potential.

15. The semiconductor device of claim 14, wherein:
a power source voltage is applied to the plurality of first semiconductor elements; and
a ground potential is applied to the plurality of second semiconductor elements.

16. The semiconductor device of claim 13, wherein adjacent two of the plurality of first semiconductor elements has a common portion, which is set at a specific potential.

17. The semiconductor device of claim 13, wherein:
the first trench and the second trench are filled with first and second oxide layers having specific thicknesses; and
each of the specific thicknesses T satisfies a formula of $T<V/E$, wherein:
V represents a potential difference between the first and second electric potentials; and
E represents a breakdown electric field strength of the first and second oxide layers.

18. The semiconductor device of claim 13, wherein:
one of the plurality of first semiconductor elements, which is disposed most adjacently to the first trench, has a plurality of contact portions; and
one of the plurality of contact portions, which is arranged most adjacently to the first trench, has the first electric potential.

19. The semiconductor device of claim 13, wherein the plurality of the first semiconductor elements and the plurality of second semiconductor elements are selected from a group consisting of LDMOS transistors, L-IGBT transistors, and thyristors.

* * * * *